United States Patent
Bhagat et al.

(10) Patent No.: US 8,219,060 B2
(45) Date of Patent: Jul. 10, 2012

(54) DUAL INDUCTOR CIRCUIT FOR MULTI-BAND WIRELESS COMMUNICATION DEVICE

(75) Inventors: Maulin Pareshbhai Bhagat, San Diego, CA (US); John Woolfrey, San Diego, CA (US); Jose Cabanillas, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 53 days.

(21) Appl. No.: 12/912,584

(22) Filed: Oct. 26, 2010

(65) Prior Publication Data

US 2011/0105072 A1 May 5, 2011

Related U.S. Application Data

(60) Continuation-in-part of application No. 12/826,552, filed on Jun. 29, 2010, which is a division of application No. 11/675,274, filed on Feb. 15, 2007, now Pat. No. 7,761,078.

(60) Provisional application No. 60/834,129, filed on Jul. 28, 2006.

(51) Int. Cl.
*H04B 1/28* (2006.01)

(52) U.S. Cl. ............ 455/333; 455/334; 455/552.1; 341/155; 336/200

(58) Field of Classification Search .......... 455/323, 455/333, 334, 550.1, 552.1; 341/155; 336/200, 336/223
See application file for complete search history.

(56) References Cited

U.S. PATENT DOCUMENTS

| | | | |
|---|---|---|---|
| 6,798,326 B2 | 9/2004 | Iida | |
| 6,867,677 B2 | 3/2005 | Nielson | |
| 6,876,840 B2 | 4/2005 | Shin et al. | |
| 6,972,658 B1 * | 12/2005 | Findley et al. | 336/200 |
| 6,975,841 B2 | 12/2005 | Uriu et al. | |
| 6,993,313 B2 | 1/2006 | Castillejo et al. | |
| 7,057,488 B2 | 6/2006 | Van Haaren et al. | |

(Continued)

FOREIGN PATENT DOCUMENTS

JP     2005102140     4/2005

(Continued)

OTHER PUBLICATIONS

International Search Report, PCT/US07/074718—International Search Authority, European Patent Office, Dec. 21, 2007.

(Continued)

*Primary Examiner* — Nhan Le
(74) *Attorney, Agent, or Firm* — Eric Ho

(57) ABSTRACT

This disclosure describes a dual inductor circuit, which may be particularly useful in a mixer of a wireless communication device to allow the mixer to operate for two different frequency bands or in a multi-differential branch low noise amplifier wherein each of the differential branches possess a different set of gain and linearity characteristics for a signal operating at the same frequency. The dual inductor circuit comprises an inductor-within-inductor design in which a small inductor is disposed within a large inductor. The two inductors may share a ground terminal, but are otherwise physically separated and independent from one another. Terminals of the inner inductor, for example, are not tapped from the outer inductor, which can reduce parasitic effects and electromagnetic interference relative to tapped inductor designs. The independence of the inductors also allows the different inductors to define different resonance frequencies or gain and linearity characteristics, which is desirable.

13 Claims, 10 Drawing Sheets

U.S. PATENT DOCUMENTS

| | | | |
|---|---|---|---|
| 7,239,851 B2 * | 7/2007 | Kosemura et al. | 455/78 |
| 7,248,480 B2 * | 7/2007 | Chiba | 361/776 |
| 2002/0013134 A1 | 1/2002 | Castillejo et al. | |
| 2003/0054791 A1 | 3/2003 | Sayers | |
| 2004/0017278 A1 | 1/2004 | Castaneda et al. | |
| 2004/0217839 A1 * | 11/2004 | Haaren et al. | 336/200 |
| 2005/0052272 A1 | 3/2005 | Tiebout | |
| 2005/0156774 A1 | 7/2005 | Li et al. | |
| 2005/0195061 A1 * | 9/2005 | Terrovitis | 336/200 |
| 2006/0181385 A1 | 8/2006 | Hurley | |
| 2006/0181386 A1 | 8/2006 | Lee et al. | |

FOREIGN PATENT DOCUMENTS

| | | |
|---|---|---|
| JP | 2005303839 | 10/2005 |
| WO | WO 2007/006867 | 1/2007 |

OTHER PUBLICATIONS

Written Opinion, PCT/US07/074718—International Search Authority, European Patent Office, Dec. 21, 2007.

* cited by examiner

DUAL INDUCTOR CIRCUIT FOR MULTI-BAND WIRELESS COMMUNICATION DEVICE

CLAIM OF PRIORITY UNDER 35 U.S.C. §120

The present application for patent is a Continuation-in-part of U.S. patent application Ser. No. 12/826,552, filed Jun. 29, 2010, which is a divisional application of U.S. patent application Ser. No. 11/675,274, filed Feb. 15, 2007, now U.S. Pat. No. 7,761,078, which claims the benefit of priority to U.S. Provisional Application No. 60/834,129, filed Jul. 28, 2006. The entire contents of U.S. patent application Ser. Nos. 12/826,552 and 11/675,274 and U.S. Provisional Application No. 60/834,129 are incorporated herein by reference.

FIELD

This disclosure relates to inductors that can be implemented within wireless communication devices, and more particularly on-chip inductor circuits used in wireless communication devices.

BACKGROUND

Inductors are common electrical circuit elements implemented within wireless communication devices and a wide range of other electronic devices. Although inductors are very useful and desirable, they are often one of the most space-consuming elements of a radio frequency integrated circuit (RFIC). In an RFIC, inductors may be commonly used within amplifier elements of the RFIC component commonly referred to as the "mixer." A mixer generally refers to the portion of an RFIC which generates (i.e., mixes) a baseband signal from a received carrier waveform. Mixers are also used on the transmitter side, e.g., to modulate a baseband signal onto a carrier.

On the receiver side, the mixer receives a waveform, which typically includes a carrier wave modulated with a baseband data signal. The mixer may include an amplifier element to properly tune the received waveform. The mixer synthesizes a copy of the carrier wave, e.g., using a local oscillator (LO) of the device. The mixer then removes the baseband signal from the received waveform by essentially subtracting the carrier wave generated by the LO from the received waveform. Once removed from the carrier, the baseband signal can then be converted into digital samples and demodulated, e.g., by a digital circuit.

An inductor may be used within the amplifier element of the mixer in order to set the performance of the mixer to a particular operating frequency. Some wireless communication devices support multiple frequency bands, in which case, multiple mixers are typically needed. Moreover, each mixer requires its own inductor to set its performance at the operation frequency associated with the respective mixer. The use of several different mixers to support multiple frequency bands is undesirable, particularly due to the space consumption that would be required within the RFIC to accommodate the different inductors.

SUMMARY

In general, this disclosure describes a dual inductor circuit, which may be particularly useful in a dual frequency application such as in a mixer of a wireless communication device to allow the mixer to operate for different frequency bands or in single frequency application such as in a low noise amplifier which provides the LNA with different gain and linearity characteristics while operating in the same frequency band.

The dual inductor circuit comprises an inductor-within-inductor design in which a small inductor is disposed within a large inductor. The two inductors may share a ground terminal, but are otherwise physically separated and independent from one another. Thus, the inductors and terminals may be electrically isolated from one another. Terminals of the inner inductor, for example, are not tapped from the outer inductor, which can reduce parasitic effects and electromagnetic interference relative to tapped inductor designs. The independence of the inductors also allows the different inductors to define different resonance frequencies, which is highly desirable.

In one aspect, this disclosure provides a multi-band wireless communication device comprising a mixer that mixes baseband signals from received signals. The mixer comprises a dual inductor circuit including a first inductor defining a first terminal and a second terminal, wherein the first inductor coils from the first and second terminals to a ground terminal. The dual inductor circuit also includes a second inductor disposed inside the first inductor, the second inductor defining a third terminal and a fourth terminal, wherein the second inductor coils from the third and fourth terminals to the ground terminal, and wherein third and fourth terminals of the second inductor are independent from the first inductor. Thus, electrically isolating the inductor coils and respective terminals from one another.

In another aspect, this disclosure provides a dual inductor circuit comprising a first inductor defining a first terminal and a second terminal, wherein the first inductor coils from the first and second terminals to a ground terminal, and a second inductor disposed inside the first inductor, the second inductor defining a third terminal and a fourth terminal, wherein the second inductor coils from the third and fourth terminals to the ground terminal, and wherein third and fourth terminals of the second inductor are independent from the first inductor.

In another aspect, this disclosure provides a method comprising mixing received wireless signals to baseband signals using a selected inductor of a dual inductor circuit in a wireless communication device, the dual inductor circuit including a first inductor defining a first terminal and a second terminal, wherein the first inductor coils from the first and second terminals to a ground terminal, and a second inductor disposed inside the first inductor, the second inductor defining a third terminal and a fourth terminal, wherein the second inductor coils from the third and fourth terminals to the ground terminal, and wherein third and fourth terminals of the second inductor are independent from the first inductor.

In an added example, this disclosure provides a multi-band wireless communication device comprising a mixer that mixes baseband signals onto a carrier. The mixer comprises a dual inductor circuit including a first inductor defining a first terminal and a second terminal, wherein the first inductor coils from the first and second terminals to a ground terminal, and a second inductor disposed inside the first inductor, the second inductor defining a third terminal and a fourth terminal, wherein the second inductor coils from the third and fourth terminals to the ground terminal, and wherein third and fourth terminals of the second inductor are independent from the first inductor.

In another embodiment, this disclosure describes a dual inductor circuit, which may be particularly useful in a low noise amplifier of a wireless communication device to allow the low noise amplifier to possess different gain and linearity characteristics while operating in the a single frequency band. This disclosure provides a multi-differential branch circuit comprising a first differential branch comprising a first planar inductor defining a first terminal and a second terminal, wherein the first planar inductor coils from the first and second terminals to a ground terminal. The first differential branch exhibiting a first set of gain and linearity characteristics at a first frequency dependent upon the characteristics of the first planar inductor. The multi-differential branch circuit further comprising a second differential branch comprising a second planar inductor disposed inside the first planar inductor of the first differential branch circuit, the second planar inductor defining a third terminal and a fourth terminal, wherein the second planar inductor coils from the third and fourth terminals to the ground terminal, and wherein the third and fourth terminals of the second planar inductor are independent from the first planar inductor. The second differential branch exhibiting a second set of gain and linearity characteristics at the same first frequency dependent upon the characteristics of the second planar inductor. The multi-differential branch circuit further comprising a third differential branch defining a fifth terminal and a sixth terminal, wherein the third differential branch includes no inductor coil and exhibits a third set of gain and linearity characteristics at the same first frequency resulting from the lack of a inductor coil.

Additional details of various examples are set forth in the accompanying drawings and the description below. Other features, objects and advantages will become apparent from the description and drawings, and from the claims.

DETAILED DESCRIPTION

Figure 1:
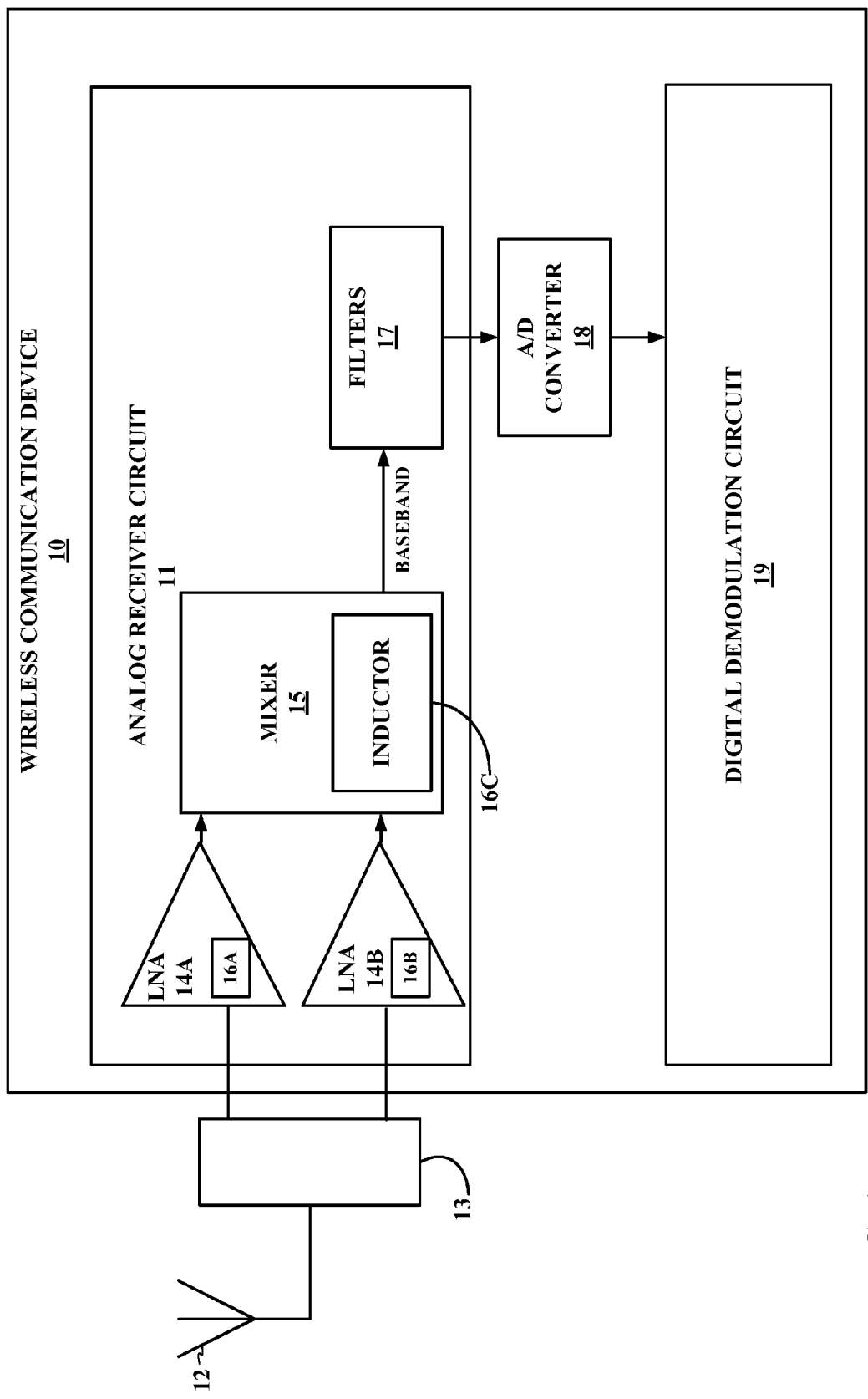
FIG. 1 is a block diagram of a multi-band wireless communication device according to an example of this disclosure.

This disclosure describes a dual inductor circuit which may be used in a multitude of application. For example, the dual inductor circuit may have applications in a dual mode or dual frequency mode where signals having varying frequencies are manipulated. The dual inductor circuit may also be useful in a single frequency mode where manipulation of signals having the same frequency is performed. For example, the dual frequency mode may be particularly useful in a mixer of a wireless communication device to allow the mixer to operate for two different frequency bands. The dual inductor circuit comprises an inductor-within-inductor design in which a small inductor is disposed within a large inductor. The two inductors may share a ground terminal, but are otherwise physically separated and independent from one another. Terminals of the inner inductor, for example, are not tapped from the outer inductor, and this can reduce parasitic effects and electromagnetic interference relative to tapped inductor designs. The respective independence of the inductors also allows the different inductors to define different resonance frequencies, which is desirable.

Moreover, the dual inductor circuit may also be particularly useful in a single frequency application such as in a low noise amplifier. The dual inductor provides the low noise amplifier with signal paths which exhibit varying gain and linearity characteristics when the low noise amplifier is operating within a single frequency band. By providing signal paths with varying gain and linearity characteristics, the optimal signal path may be chosen for implementation depending upon the characteristics of an input signal operating within a single frequency band. Various embodiments are disclosed which describe the utilization of the dual inductor circuit in a dual frequency mode and/or a single frequency mode.

The maximum interference between both inductors occurs at either inductor's self resonant frequency. A tapped inductor's self resonant frequency, however, is determined by the entire structure and not individual inductor coils. In an application using a tapped inductor, it is possible that the self resonant frequency of the structure may occur near the desired operating frequency of the inner coil. In such a case, performance of the circuit using the inner coil can be drastically impacted.

In contrast to a tapped inductor design, the inductor-inside-inductor topology described herein may have two independent self resonant frequencies, one for each independent inductor coil. The outer inductor coil can have a lower self resonant frequency than the inner inductor coil, and for some applications it is possible this resonant frequency can approach the desired operating frequency of the inner inductor coil. In such a situation, impact to performance of the circuit using the inner inductor coil can be minimized due to isolation between the two different inductor coils. Therefore, due to low coupling between both inner and outer coils, two separate self resonant frequencies can exist, which can make the inductor-inside-inductor more desirable and can reduce or eliminate any negative impact on the performance of the inner inductor coil.

FIG. 1 is a block diagram of a multi-band wireless communication device 10 according to an example of this disclosure. The block diagram of FIG. 1 is simplified for purposes of explanation of the dual inductor circuit of this disclosure. Many other components (not illustrated) may also be used in device 10. Device 10 may comprise a cellular or satellite radiotelephone, a radiotelephone base station, a computer that supports one or more wireless networking standards, a wireless access point for wireless networking, a PCMCIA card incorporated within a portable computer, a direct two-way communication device, a personal digital assistant (PDA) equipped with wireless communication capabilities, and the like. These and many other types of devices may use the dual inductor circuit designs described herein.

Device 10 may implement one or more of a wide variety of wireless communication standards or techniques. Examples of wireless communication techniques include frequency division multiple access (FDMA), time division multiple access (TDMA) and various spread spectrum techniques. One common spread spectrum technique used in wireless communication is code division multiple access (CDMA) signal modulation in which multiple communications are simultaneously transmitted over a spread spectrum signal.

Furthermore, some wireless standards make use of two or more techniques, such as GSM systems, which use a combination of TDMA and FDMA modulation. GSM stands for "Global System for Mobile Communications." A number of wireless networking standards, and other wireless communication standards and techniques have also been developed, including several IEEE 802.11 standards, Bluetooth standards, and emerging ultra-wideband (UWB) techniques and standards.

Device 10 may be referred to as "multi-band" insofar as it supports wireless communication in two or more wireless frequency bands. As an example, device 10 may support CDMA or GSM wireless communication in one frequency band, e.g., around 2.4 gigahertz (GHz), and may also support legacy analog wireless communication in another frequency band, e.g., around 800 megahertz (MHz). As another example, device 10 may support CDMA and/or GSM wireless communications in two different frequency bands, e.g., around 1.8 GHz and 2.4 GHz, respectively. The dual inductor circuit designs described herein may help to support any two frequency bands, and may be used with a wide variety of wireless communications. The frequency bands and standards listed herein are merely exemplary.

Device 10 may comprise an analog receiver circuit 11 and a digital demodulation circuit 19. Analog receiver circuit 11 may comprise a so-called radio frequency integrated circuit (RFIC). Digital demodulation circuit 19 may comprise a digital modem (modulation-demodulator). Circuits 11 may be fabricated on separate chips or a common chip.

As illustrated, device 10 includes an antenna 12 that receives wireless signals. The wireless signals may be separated into different paths by signal path separation circuit 13. Thus, the dual band design allows a single antenna to receive two different signal frequencies, although in other cases, separate antennas could be used to receive the different signals at the different frequencies. In FIG. 1, for each signal path, the respective signal is scaled by a low noise amplifier (LNA) 14A or 14B and delivered to mixer 15. LNAs 14A, 14B and mixer 15 may make use of a dual inductor circuit 16A, 16B, or 16C as described herein. Thus, the dual inductor circuit may be used to provide a degeneration inductor for a same frequency band but with different gain and linearity modes as used, for example, in an LNA application or as degeneration inductor for two different frequency bands as used, for example, in a mixer application.

For example, when a dual inductor circuit 16A and/or 16B may be applied to an LNA 14A and/or 14B, dual inductor circuits 16A and/or 16B may each provide a multi-branch LNA wherein each of the multi-branches possesses a different set of gain and linearity characteristics applicable to input signals having the same frequency. The different sets of gain and linearity characteristics result from the different sized inductors included in each branch. A received signal operating a particular frequency (i.e., cell, PCS, data, etc.) may be coupled to a specific LNA 14A or 14B designated to accept signals operating in a particular frequency. The selected LNA 14A or 14B may be required to amplify the received signal using different gain and linearity characteristics depending on various characteristics of the received signal. For example, if it is determined that the received signal has contains lot of noise and interference, it may not be desirable to amplify with high gain, but it may require high linearity. Alternatively, if little noise is detected it may be desirable to amplify the signal with high gain and only require low linearity. Still further, the received signal may only require a moderate gain and moderate linearity. Thus, the received signal to the branch of the LNA having a set of gain and linearity characteristics suitable for the received signal.

In the case of the mixer 15, a dual inductor circuit 16C may allow the mixer to handle two or more different frequency bands. In particular, dual inductor circuit 16C may be implemented within an amplifier (not shown in FIG. 1) of mixer 15. The amplifier of mixer 15 scales the wireless signals from a respective one of LNAs 14A or 14B and then mixes the signal to baseband.

The received wireless signal may comprise a carrier waveform modulated with a baseband signal. Mixer 15 removes the baseband signal from the carrier of the received signal so that sampling and demodulation can be performed on the baseband signal. In particular, mixer 15 may receive a reference waveform produced by a local oscillator (not shown) of device 10. Mixer 15 subtracts the reference waveform from the received wireless signal to remove the carrier and produce the baseband signal. The baseband signal is then filtered by one or more filters 17. An analog-to-digital (A/D) converter 18 converts the baseband signal into digital baseband samples, which are forwarded to a digital demodulation circuit 19 for demodulation.

Mixer 15 is a dual band mixer in that it supports two different frequency bands, e.g., a first signal in a first frequency band from LNA 14A and a second signal in a second frequency band from LNA 14B. Device 10 may operate in two different modes, which support wireless communication at the two different frequency bands. These two modes may comprise an analog and digital mode, two different digital modes, or possibly two different analog modes. Dual inductor circuit 16C includes two different independent inductors. One of the inductors (a smaller coil) is disposed inside the other inductor (a larger coil). In this manner, dual inductor circuit 16C provides the ability to support two different frequency bands, yet achieves a relatively compact and efficient two-dimensional circuit design.

Any of dual inductor circuits 16A, 16B, and/or 16C may have reduced parasitics and electromagnetic interference relative to inductor circuits that employ a tapped inductor configuration. The two inductors of dual inductor circuits 16A, 16B, and/or 16C may share a ground terminal, but are otherwise physically separated and independent from one another. Unlike tapped inductor configurations, for example, terminals of the inner inductor of circuits 16A, 16B, and/or 16C are not tapped from the outer inductor. This also allows the two inductors of dual inductor circuit 16 to define different resonance frequencies which is advantageous in the mixer application where signals of varying frequency are received. The dual inductor circuit 16 may also provide two inductors which may produce different gain and linearity characteristics when applied to signals of the same frequency as in the LNA application where received signals have the same frequency.

The details of this disclosure primarily refer to a mixer on the receiver side, e.g., that mixes baseband signals from a received signal. However, this disclosure also contemplates the use of the described dual inductor circuits in mixers on the transmitter side, e.g., that modulates a carrier with a baseband signal. Moreover, many other devices, including devices unrelated to wireless communication could implement the disclosed dual inductor circuits outlined in greater detail below.

For illustrative purposes, the application of the dual inductor circuit 16C in a multi frequency mode is described in relation to a mixer 15, 20. In addition, the application of the dual inductor circuits 16A and 16B in a single frequency mode is described in relation to a LNA 14A, 14B. One of skill in the art would understand that the dual inductor circuits 16A, 16B, and/or 16C may be implemented in other elements and components using multiple inductors in either a multi or single frequency mode application.

Figure 2:
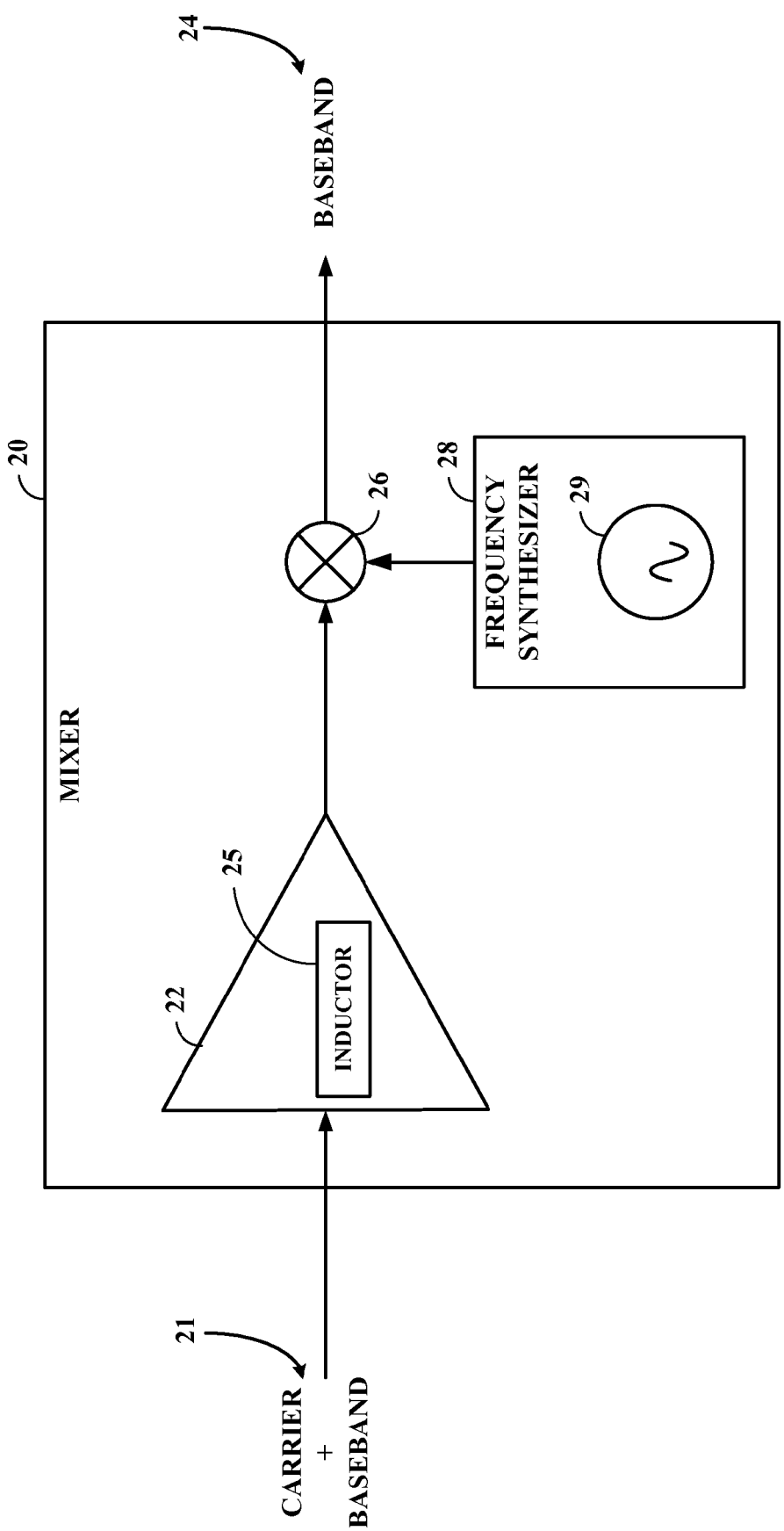
FIG. 2 is a block diagram of a mixer suitable for incorporation in the wireless communication device of FIG. 1 according to an example of this disclosure.

FIG. 2 is a block diagram of a mixer 20 according to an example of this disclosure, which may correspond to mixer 15 of FIG. 1. As shown, mixer 20 receives a wireless signal 21 that comprises a baseband signal modulated on a carrier wave. Amplifier 22 is a tuning element that conditions wireless signal 21 for mixing. Amplifier 22 includes a dual inductor circuit 25, as described in this disclosure, in order to allow mixer 20 to handle signals at two different frequency bands. A mode may be selected, and based on the selected mode the dual inductor circuit 25 may be set accordingly.

Mixing switcher 26 receives the wireless signal that is properly scaled by amplifier 22. Mixer switcher 26 also receives a reference waveform from frequency synthesizer 28. Frequency synthesizer 28 may access a local oscillator (LO) 29 to generate the reference waveform at the expected frequency. In order to support two different frequencies, frequency synthesizer 28 may implement adding techniques, subtracting techniques, feed forward techniques, feed back techniques, or the like, to generate signals at different desired frequencies. Alternatively, two different LO's could be used.

In any case, once a proper reference waveform is provided by frequency synthesizer 28, mixer switcher 26 subtracts the reference waveform from the tuned wireless signal, which includes the carrier and the baseband signal. In this manner, mixer 20 removes the carrier to generate baseband signal 24. Baseband signal 24 can then be processed, possibly converted to digital samples, and then demodulated. In some cases, however, the demodulation could be done in an analog domain, particularly for legacy analog wireless formats or standards.

As described herein, mixer 20 supports at least two different frequency bands. In order to achieve such dual mode functionality in an efficient manner, this disclosure provides dual inductor circuit 25. As described in greater detail below, dual inductor circuit 25 comprises an inductor-within-inductor design in which a relatively small inductor is disposed within a relatively large inductor. Again, the two inductors may share a ground terminal, but are otherwise physically separated and independent from one another. Terminals of the inner inductor, for example, are not tapped from the outer inductor, and this design can reduce parasitic effects and electromagnetic interference relative to tapped inductor designs. This also allows the different inductors of dual inductor circuit 25 to define different self resonance frequencies.

Figure 3:
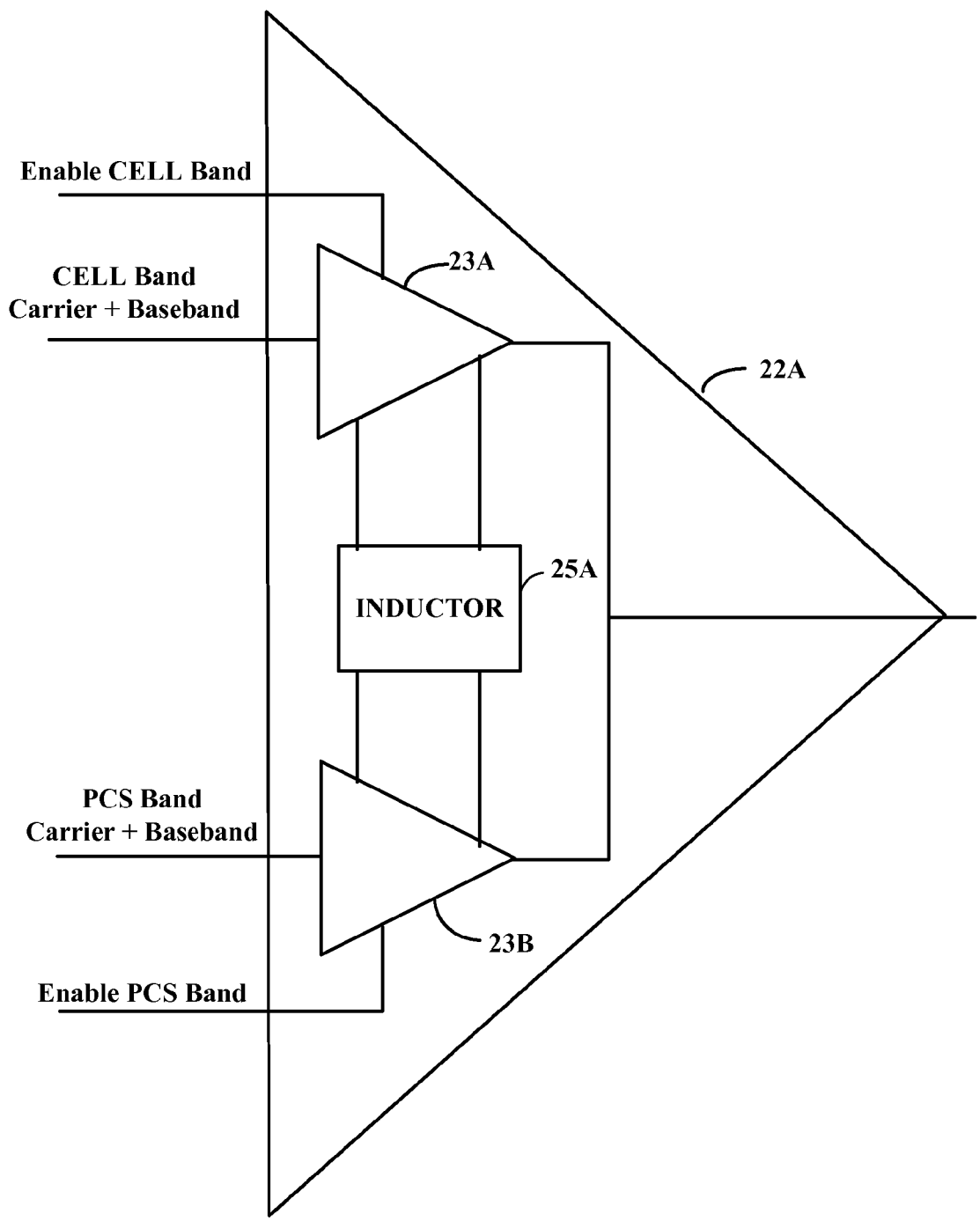
FIG. 3 is a more detailed example of one amplifier design that may use an inductor circuit of this disclosure.

FIG. 3 is a more detailed example of one example of an amplifier 22A that may use an inductor circuit of this disclosure. Amplifier 22A may correspond to amplifier 22 of FIG. 2. Amplifier 22A itself includes two different amplifier circuits 23A and 23B, which operate with respect to the different frequency bands. In particular, amplifier circuit 23A may be used to scale signals in a cellular band and amplifier circuit 23B may be used to scale signals in a PCS band. Importantly, however, each of amplifier circuits 23A and 23B couple to a common inductor circuit 25A. Inductor circuit 25A employs an inductor-within-inductor design, as describe herein. An outer coil of inductor circuit 25A may be used to accommodate cellular band signals scaled by amplifier circuit 23A and an inner coil of inductor circuit 25A may be used to accommodate PCS signals scaled by amplifier circuit 23B.

Each amplifier circuit 23A and 23B is connected to the appropriate inductor terminals of inductor circuit 25A. The outputs of each amplifier circuit 23A and 23B are connected together before entering the mixer switcher 26 (FIG. 2). Control signals ("Enable CELL Band" and "Enable PCS Band") may be used to select the appropriate amplifier at any given time. Enabling the cell band will disable the PCS band, and enabling the PCS band will disable the cell band.

Figure 4:
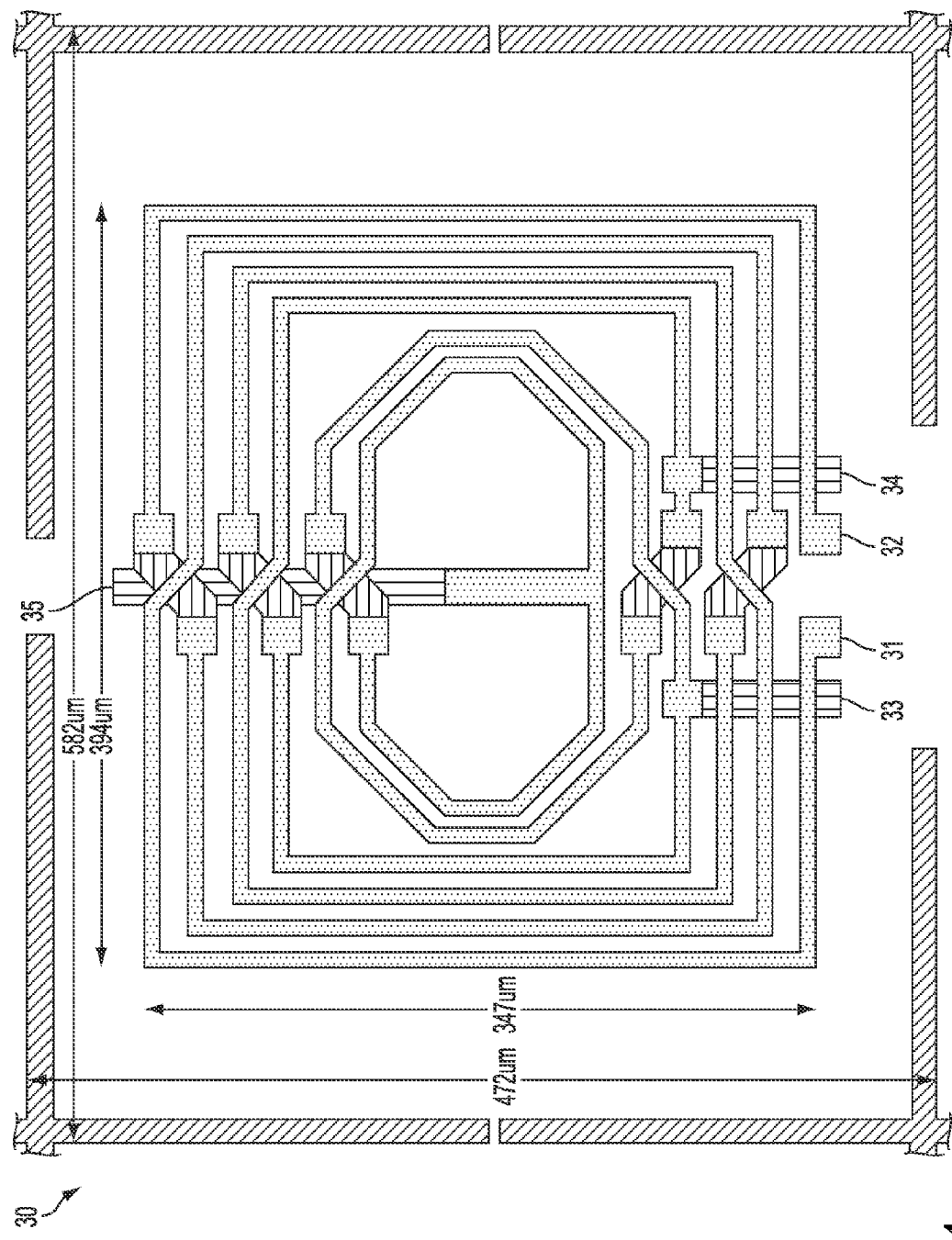
FIG. 4 is a circuit layout diagram of a conventional inductor circuit that implements a tapped configuration in which a small inner inductor is tapped from a larger inductor.

FIG. 4 is a circuit layout diagram of a conventional inductor circuit 30 that implements a tapped configuration in which a small inner inductor is tapped from a larger inductor. Inductor circuit 30 is less desirable than the other inductor circuits described herein because it uses one large coil from terminals 31 and 32 to ground terminal 35. A smaller inductor is created by tapping into the large inductor at an intermediate location, i.e. via terminals 33 and 34. The small inductor that extends beyond these intermediate taps at terminals 33 and 34, however, adds substantial parasitic capacitance effects and interference, which can substantially degrade the performance of inductor circuit 30. In addition, because the smaller inductor is tapped from the larger inductor, the different inductors of inductor circuit 30 typically have the same resonance frequency. Exemplary dimensions of inductor circuit 30 are labeled.

Figure 4A:
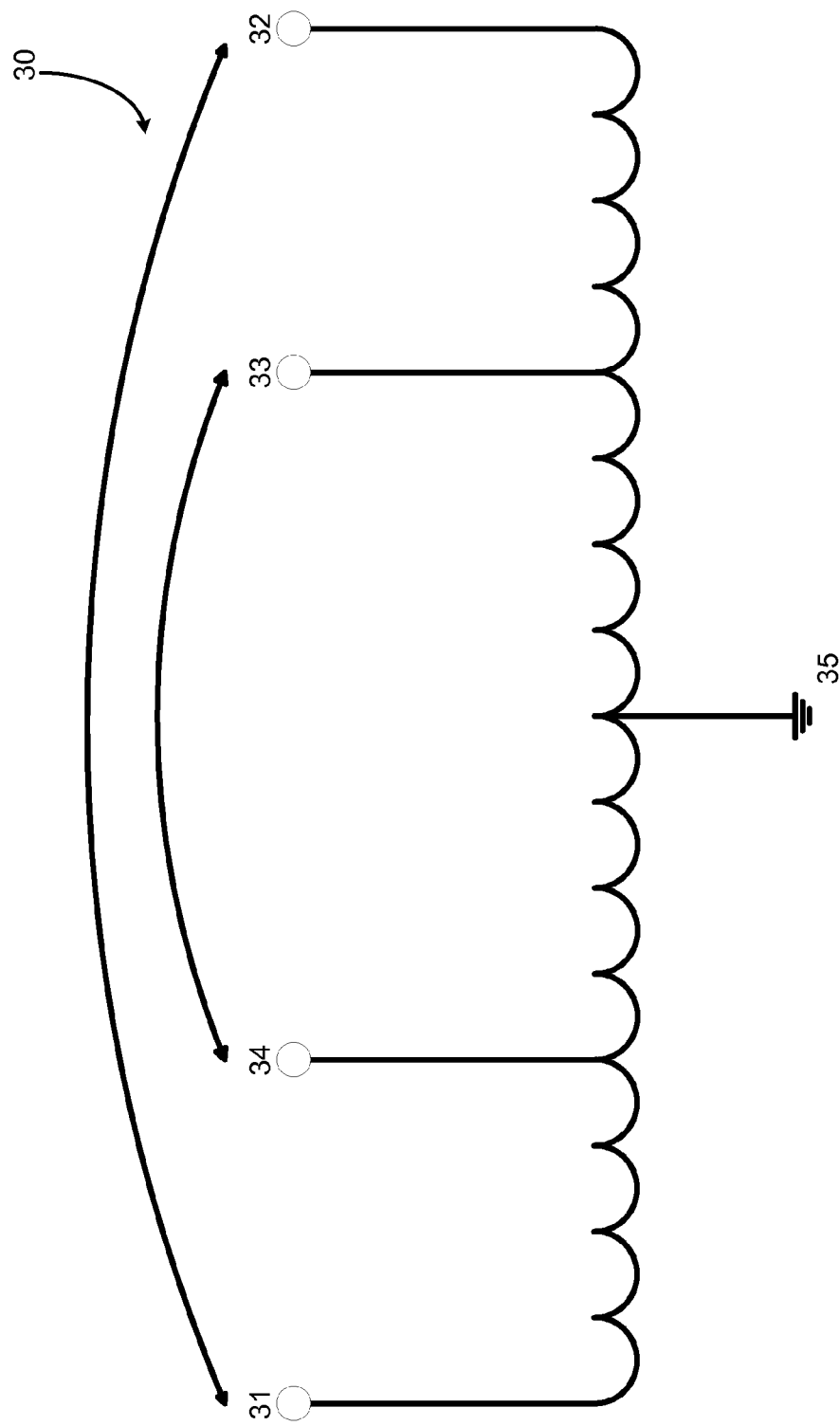
FIG. 4A is a schematic circuit diagram of the conventional inductor circuit of FIG. 4 that implements a tapped configuration.

FIG. 4A illustrates the conventional inductor circuit shown in FIG. 4 as a schematic circuit diagram. As shown in FIG. 4A, a large coil couples terminals 31 and 32 to ground 35. A smaller inductor is created by tapping into the large inductor at an intermediate location, i.e. via terminals 33 and 34. As discussed above, tapping the larger inductor at an intermediate location may add parasitic capacitance effects and interference, which can substantially degrade the performance of the inductor circuit 30. In addition, because the smaller inductor is tapped from the larger inductor, the different inductors of the inductor circuit 30 typically have the same resonance frequency.

Figure 5:
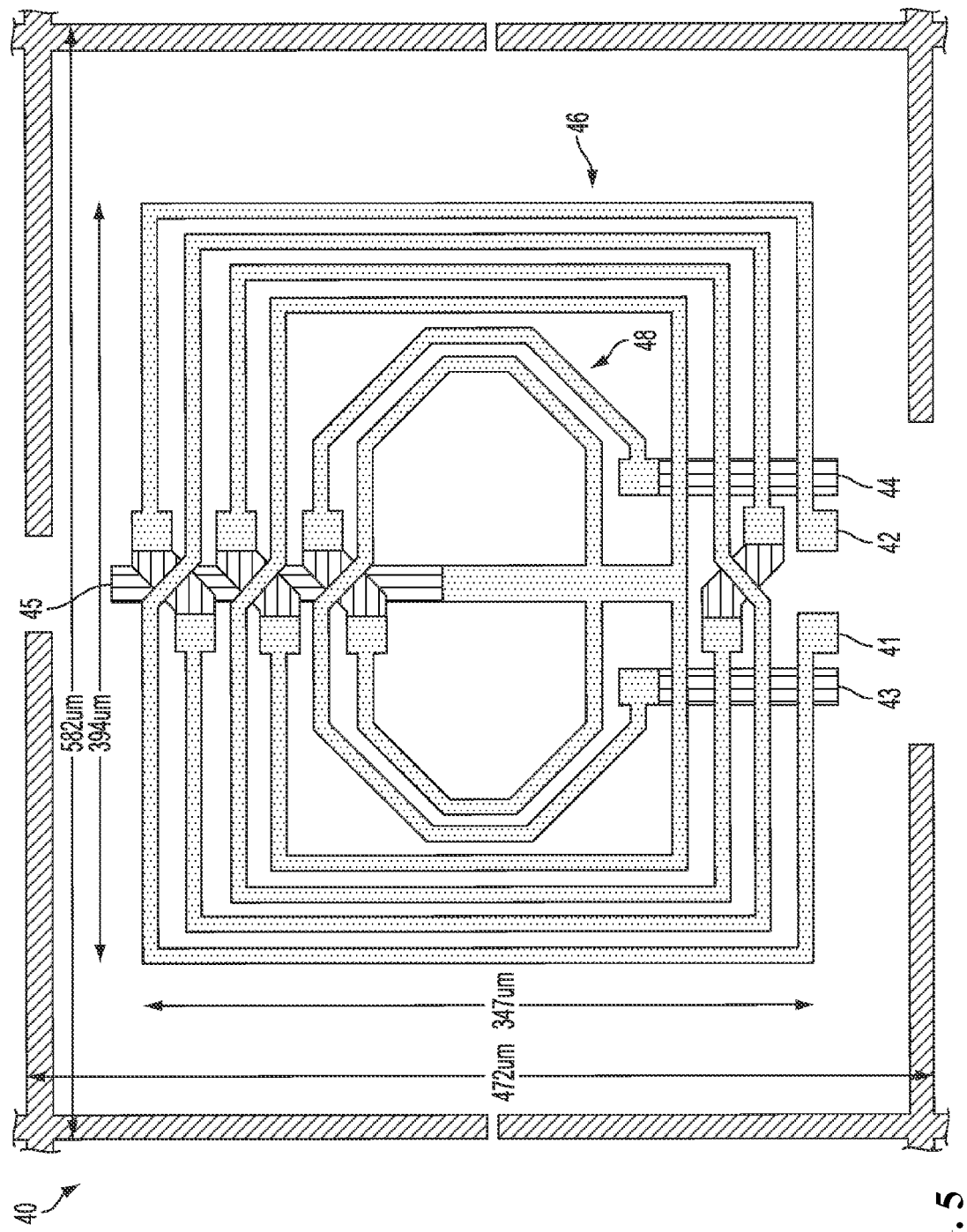
FIG. 5 is an exemplary circuit layout diagram of a dual inductor circuit that comprises an inductor independently disposed within larger inductor according to an embodiment of this disclosure.
Figure 6:
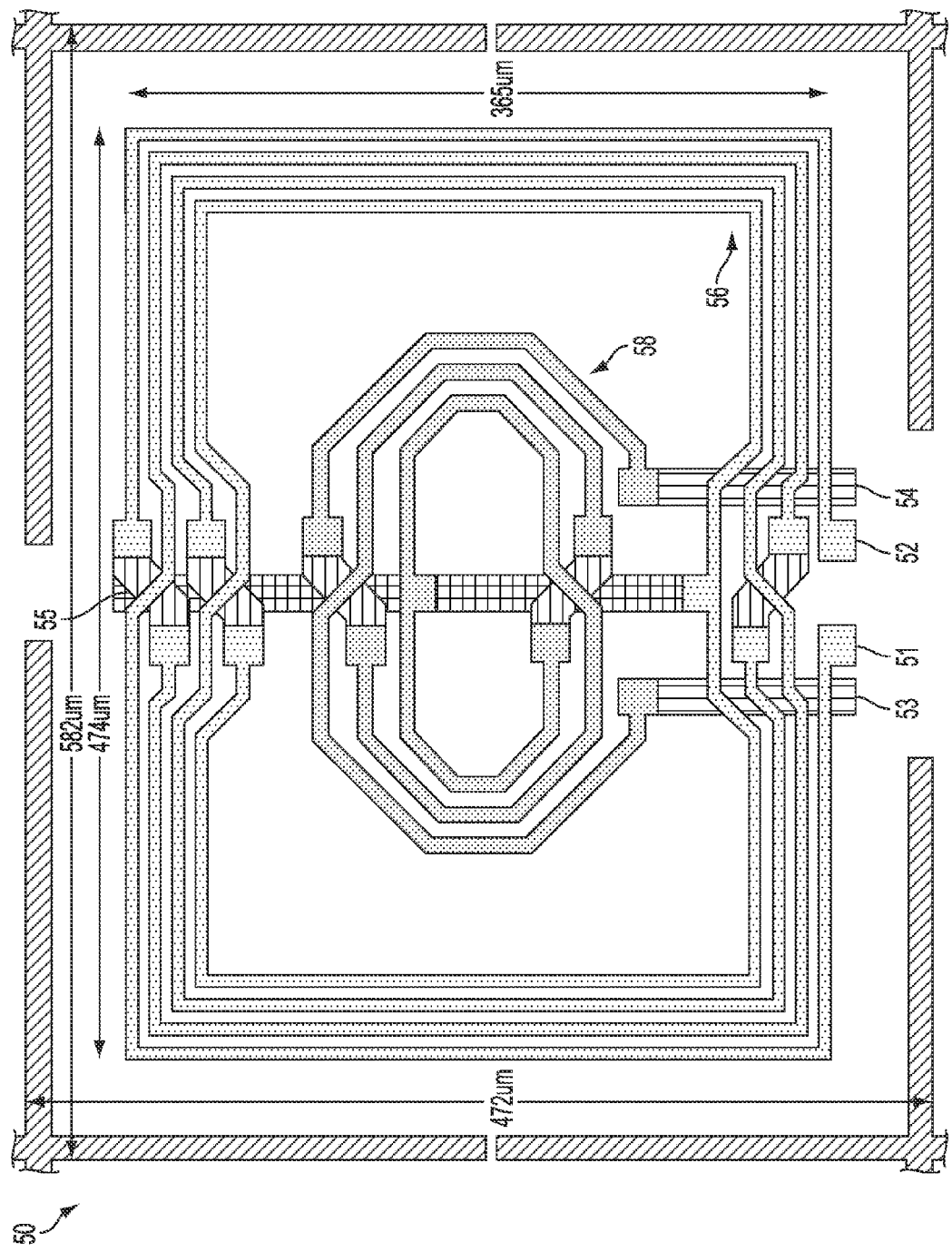
FIG. 6 is another exemplary circuit layout diagram of a dual inductor circuit that comprises an inductor independently disposed within larger inductor according to another embodiment.

The inductor designs shown in FIGS. 5 and 6 may overcome these or other shortcomings of the inductor circuit 30 of FIG. 4. FIGS. 5 and 6 are exemplary circuit layout diagrams of dual inductor circuits 40 and 50 that comprise an inductor independently disposed within larger inductor, according to examples of this disclosure. Dual inductor circuits 40 and 50 may correspond to either of inductor circuits 16 or 25 of FIGS. 1 and 2, or could be used in another type of device. Unlike inductor circuit 30 in which the inner and outer inductors would have a common resonance frequency, the resonance frequency of the different inductors of dual inductor circuits 40 and 50 can be defined differently since the coils are independent. This is highly desirable.

In particular, in contrast to a tapped inductor design, the inductor-inside-inductor topology shown in FIGS. 5 and 6 may have two independent self resonant frequencies, one for each independent inductor coil. The outer inductor coil can have a lower self resonant frequency than the inner inductor coil, and for some applications it is possible this resonant frequency can approach the desired operating frequency of the inner inductor coil. In such a situation, impact to performance of the circuit using the inner inductor coil can be minimized due to isolation between the two different inductor coils. Therefore, due to low coupling between both inner and outer coils, two separate self resonant frequencies can exist, which can make the inductor-inside-inductor more desirable and cause less negative impact on the performance of the inner inductor coil.

As shown in FIG. 5, dual inductor circuit 40 comprises a first inductor 46 and a second inductor 48. The second inductor 48 is disposed inside first inductor 46. Both inductors 46 and 48 comprise coils that coil in a two-dimensional fashion. In this manner, circuit 40 defines an inductor-within-inductor design in which a small inductor coil (second inductor 48) is disposed within a large inductor coil (first inductor 46). For purposes of illustration, dimensions of dual inductor circuit 40 are shown in FIG. 5. However, examples of this disclosure are not necessarily limited to the sizes or shapes of the coils shown in FIG. 5.

First inductor 46 defines a first terminal 41 and a second terminal 42. First inductor 46 coils from the first and second terminals 41 and 42 to a ground terminal 45. Second inductor 48 is disposed inside first inductor 46, but is independent from first inductor 46 and is not tapped from first inductor 46. In this manner, dual inductor circuit 40 is different from inductor circuit 30 of FIG. 4, which employs a tapped configuration. In dual inductor circuit 40, second inductor 48 defines a third terminal 43 and a fourth terminal 44. Second inductor 48 coils from third and fourth terminals 43 and 44 to ground terminal 45. Again, however, third and fourth terminals 43 and 44 of the second inductor 48 are independent from the first inductor 46 insofar as third and fourth terminals 43 and 44 are not tapped from first inductor 46. First inductor 46 and second inductor 48 can be created to define different resonance frequencies.

Dual inductor circuit 40 may be included within an amplifier of a mixer in order to allow the mixer to handle two different frequency bands. First inductor 46 may set the gain of the first frequency band and second inductor 48 may set the gain of a second frequency band. Moreover, using testing and simulations, first inductor 46 can be tuned to account for parasitic effects of second inductor 48, and second inductor 48 can be tuned to account for parasitic effects of first inductor 46. Since first and second inductors 46 and 48 are isolated (not tapped from one another), these parasitic effects and feedback are significantly reduced relative to a tapped configuration like that shown in FIG. 4.

First inductor 46 may be used in a first mode of operation of a wireless communication device, and second inductor 48 may be used in a second mode of operation of the wireless communication device. The first mode of operation may be associated with a first frequency band below approximately 1.0 gigahertz (GHz) and the second mode may be associated with a second frequency band above approximately 1.0 GHz. By way of example, the first frequency band may be a legacy analog band around approximately 800 megahertz (MHz), and the second frequency band may be a band around approximately 2.4 GHz or 1.8 GHz. More generally, however, dual inductor circuit 40 could be tuned for any two frequency bands.

Figure 5A:
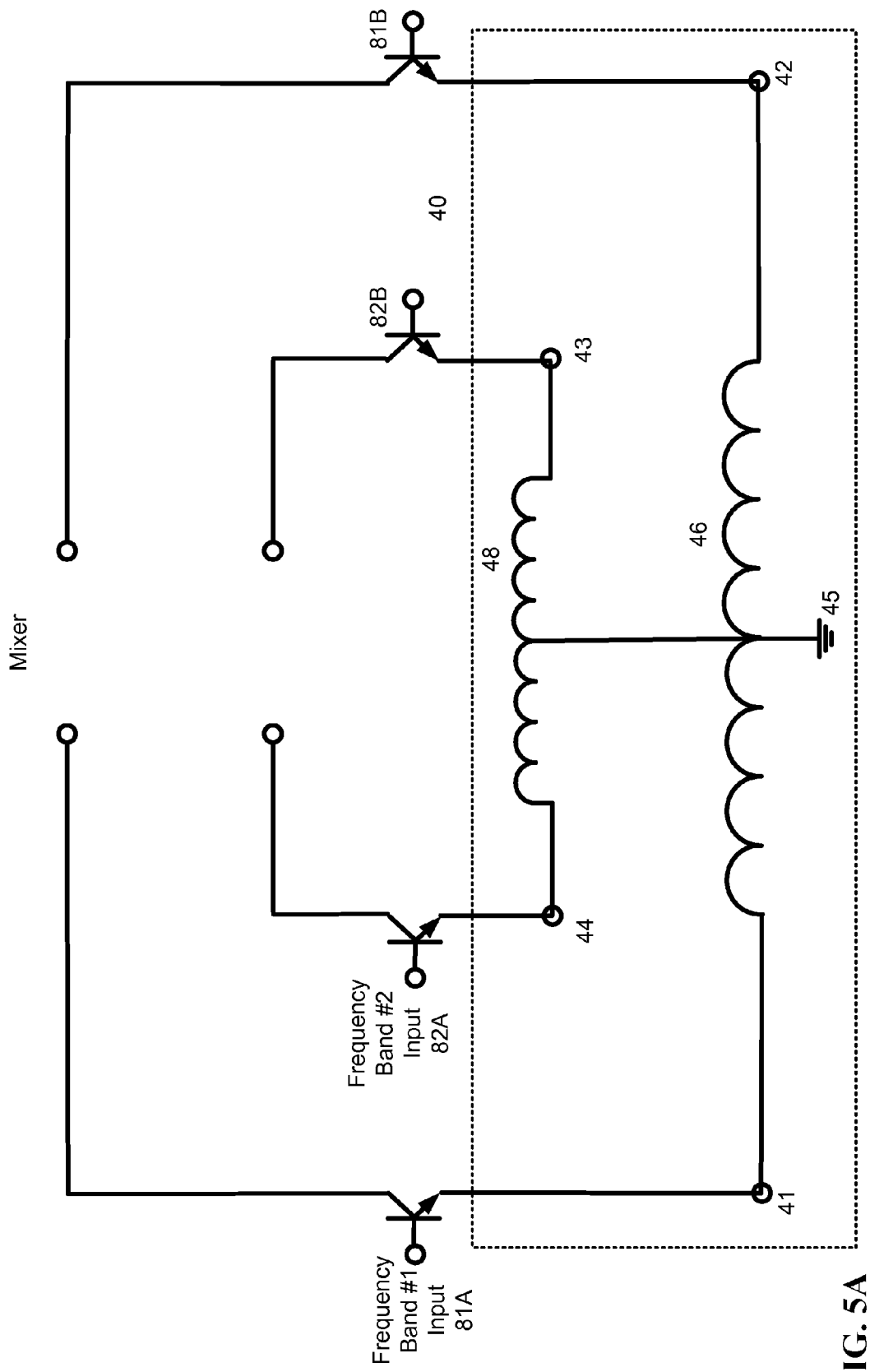
FIG. 5A is a schematic circuit diagram of a selective dual inductor circuit which enables the selection of one inductor independent of the other inductor.

FIG. 5A illustrates the dual inductor circuit shown in FIG. 5 as part of an exemplary implementation of a selective dual inductor circuit which enables the selection of one inductor independent of the other inductor. As shown in FIG. 5A, the selective dual inductor circuit includes a dual inductor circuit 40 which includes a first planar inductor 46 and a second planar inductor 48. The second planar inductor 48 may be disposed inside the first planar inductor 46. Both planar inductors 46 and 48 comprise planar coils that coil in a two-dimensional fashion. So configured, circuit 40 provides an inductor-within-inductor design in which a small planar inductor coil (second inductor 48) is disposed within a large planar inductor coil (first inductor 46).

The first planar inductor 46 couples a first terminal 41 and a second terminal 42 to a ground terminal 45. The second planar inductor 48 may be disposed inside the first inductor 46, but is electrically independent from the first planar inductor 46 and is not tapped from the first planar inductor 46. In this manner, the dual inductor circuit 40 differs from the inductor circuit 30 of FIGS. 4 and 4A, which employs a tapped configuration. In the dual inductor circuit 40, the second planar inductor 48 couples a third terminal 43 and a fourth terminal 44 to a ground terminal 45. Again, the third and fourth terminals 43 and 44 of the second planar inductor 48 are independent from the first planar inductor 46 insofar as the third and fourth terminals 43 and 44 are not tapped from the first planar inductor 46. The first planar inductor 46 and the second planar inductor 48 can be configured to have different resonance frequencies.

Similar to the inductor circuit 25A illustrated in FIG. 3, the selective dual inductor circuit shown in FIG. 5A may be used to accommodate signals operating in a first Frequency Band #1 as well as signals operating in a second Frequency Band #2. For example, Frequency Band #1 may signals operating in a cellular band, while Frequency Band #2 may be signals operating in a PCS band, such as the case when the dual inductor circuit is implemented in a dual band mixer. Alternatively, in some embodiments, Frequency Band #1 and Frequency Band #2 may be signals operating in the same frequency band, such as the case when the dual inductor circuit is implemented in a single-band, multi-mode LNA. In the dual band mixer implementation, the dual inductor circuit 40 allows a mixer of a wireless communication device to selectively enable the first planar inductor 48 to set the mixer to the appropriate operating frequency to receive an input signal from a first Frequency Band #1 (i.e., cellular band) input, or the second planar inductor 48 to set the mixer to the appropriate operating frequency to receive an input signal from a second Frequency Band #2 (i.e., PCS band) input. Selection transistors 81A, 81B, 82A, and 82B enable the independent selection of either the first planar inductor 46 or the second planar inductor 48 to the mixer. By placing an appropriate selection voltage to the gate of selection transistor pairs 81A and 81B, the first planar inductor 46 may be connected to the mixer. Alternatively, by placing an appropriate selection voltage to the gate of selection transistor pairs 82A and 82B, the second planar inductor 48 may be connected to the mixer.

FIG. 6 is a circuit layout diagram providing another illustrative example of a dual inductor circuit 50 according to this disclosure. Dual inductor circuit 50 comprises a first inductor 56 and a second inductor 58. Both inductors 56 and 58 comprise coils that coil in a two-dimensional fashion. The two-dimensional layout of second inductor 58 is disposed inside the two-dimensional layout of first inductor 56. Dimensions of dual inductor circuit 50 are shown in FIG. 6. However, examples of this disclosure are not necessarily limited to the sizes or shapes of the coils shown in FIG. 6.

In many respects, dual inductor circuit 50 of FIG. 6 is similar to dual inductor circuit 40 of FIG. 5. In particular, in dual inductor circuit 50, first inductor 56 defines a first terminal 51 and a second terminal 52, and first inductor 56 coils from the first and second terminals 51 and 52 to a ground terminal 55. Second inductor 58 is disposed inside first inductor 56, but is independent from first inductor 56 and is not tapped from first inductor 56. In this manner, dual inductor circuit 50, like dual inductor circuit 40, is different from inductor circuit 30 of FIG. 4, which defines a tapped configuration.

In dual inductor circuit 50, second inductor 58 defines a third terminal 53 and a fourth terminal 54. Second inductor 58 coils from third and fourth terminals 53 and 54 to ground terminal 55. Third and fourth terminals 53 and 54 of the second inductor 58 are independent from the first inductor 56 insofar as third and fourth terminals 53 and 54 are not tapped from first inductor 56. This also allows first inductor 56 and second inductor 58 to be created to define different resonance frequencies, which is highly desirable as described above.

Dual inductor circuit 50 may be included within an amplifier of a mixer in order to allow the mixer to handle two different frequency bands. First inductor 56 may be tuned to a first frequency band and second inductor 58 may be tuned to a second frequency band. Moreover, using simulations and testing, first inductor 56 can be tuned to account for parasitic effects of second inductor 58, and second inductor 58 can be tuned to account for parasitic effects of first inductor 56. Alternatively, the dual inductor circuit 50 may be included in a single band LNA which allows the LNA to selectively apply an input signal to a branch that exhibits specific gain and linearity characteristics to suit a specific need. In the embodiment shown in FIG. 5A, each of the two branches may exhibit specific gain and linearity characteristics that vary in accordance with the size of the inductor coil (46, 48) implemented in each of the two branches. As discussed in more detail below with respect to FIG. 8, a circuit having three branches may also be implemented, where the absence of any coil in one of the branches further differentiates the gain and linearity characteristics of the three separate branches.

Dual inductor circuit 50 further reduces parasitic effects relative to dual inductor circuit 40 due to more physical separation between first inductor 56 and second inductor 58 compared to that between first inductor 46 and second inductor 48 of dual inductor circuit 40. In particular, second inductor 58 may be separated from the first inductor 56 by greater than approximately 20 microns. This can help to even further reduce or eliminate electromagnetic interference and parasitic effects between inductors 56 and 58. A surface area associated with dual inductor circuit 50 defines less than approximately 0.3 square millimeters, although this disclosure is not necessarily limited in this respect.

First and second inductors 56 and 58 are not only separated by greater than 20 microns of space, but are isolated (not tapped from one another). As discussed above, this isolation is also very useful in reducing parasitic effects and electromagnetic coupling effects between inductor 56 and 58. In particular, physical isolation of inductors 56 and 58, in contrast to a tapped configuration, can significantly reduce parasitic capacitances and electromagnetic coupling between inductors 56 and 58. In addition, this isolation allows inductors 56 and 58 to define different resonance frequencies, which can avoid performance impacts for the different frequency bands handled by the different inductors.

First inductor 56 may be used in a first mode of operation of a wireless communication device, and second inductor 58 may be used in a second mode of operation of the wireless communication device. The first mode of operation may be associated with a first frequency band below approximately 1.0 GHz and the second mode may be associated with a second frequency band above approximately 1.0 GHz. As an illustrative example, the first frequency band may be a legacy analog band around approximately 800 megahertz (MHz), and the second frequency band may be a PCS band around approximately 2.4 GHz or 1.8 GHz. More generally, however, dual inductor circuit 50 could be tuned for any two frequency bands. As an example, first inductor 56 may coil over a distance of approximately 0.35 to 0.6 millimeters, and second inductor 58 may coil over a distance of approximately 0.2 to 0.32 millimeters. The dual inductor circuit 50 may be substituted for the dual inductor circuit 40 shown in FIG. 5A to enable the selection of one planar inductor 56 independent of the other inductor 58.

Figure 7:
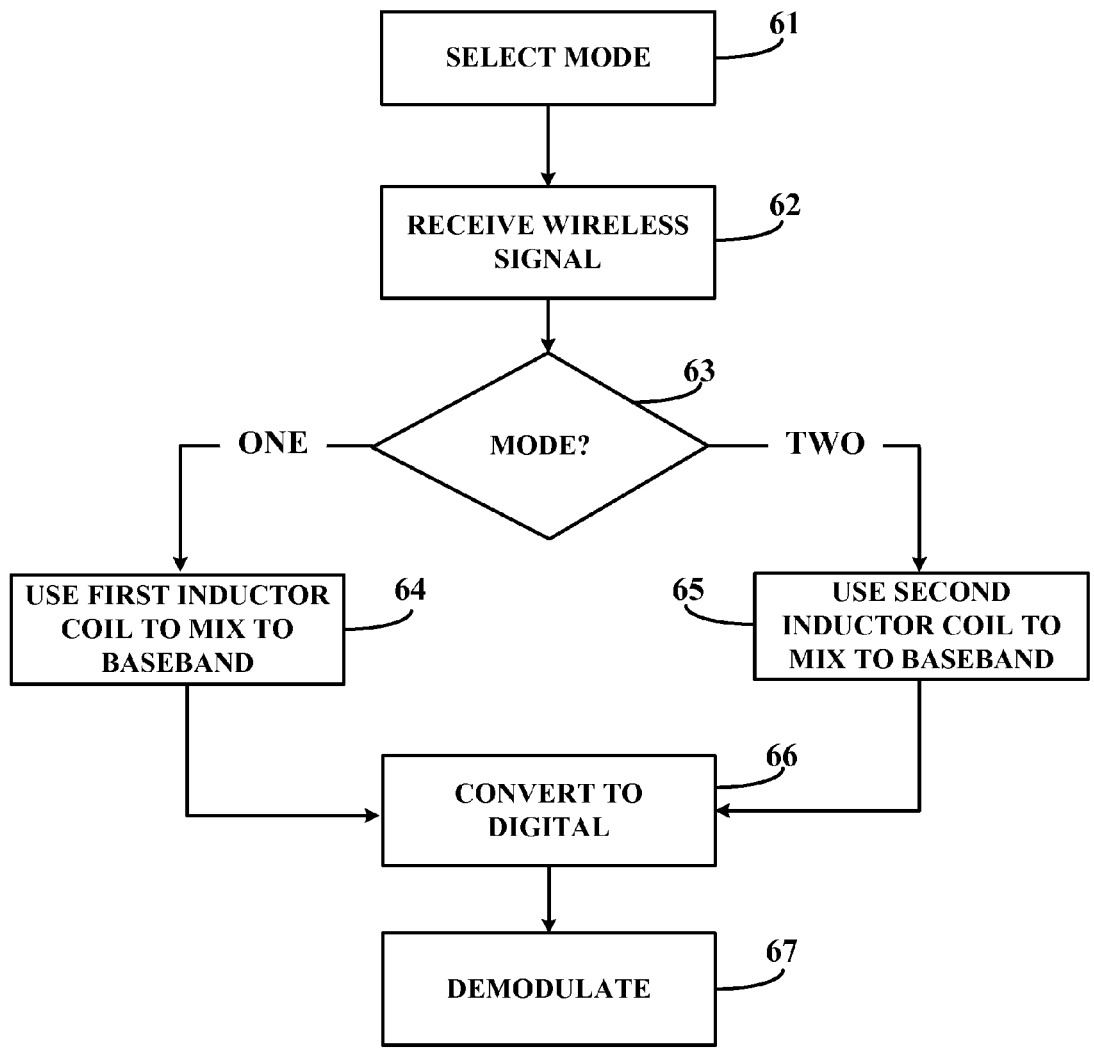
FIG. 7 is a flow diagram illustrating a method that may be executed by a wireless communication device implementing a dual inductor circuit as described herein.

FIG. 7 is a flow diagram illustrating a method that may be executed by a wireless communication device implementing a dual inductor circuit as described herein. The functionality of FIG. 7 will be described with reference to wireless communication device 10 of FIG. 1. As shown in FIG. 7, device 10 selects a mode of operation (61), such as a digital PCS mode that operates in a frequency band above 1.0 GHz, or an analog (or other mode) that operates in a frequency band below 1.0 GHz. Antenna 12 receives a wireless signal (62), which includes a baseband signal modulated onto a carrier wave. Alternatively, the selection of a mode of operation (61) may indicate a specific gain and linearity characteristic desired for the inputted signal. For example, if it is desired to amplify the input signal with a high gain and linearity characteristic, a first branch having a specifically sized inductor coil may be selected. If it is desired to amplify the input signal with a low gain and linearity characteristic, the second branch having a differently sized inductor coil may be selected. Depending on the mode of operation (63), inductor circuit 16A, 16B, or 16C may select either a first (outer) coil or a second (inner) coil.

In the embodiment where the dual inductor circuit 16 C is implemented in a mixer 15, following scaling by one of LNAs 14A or 14B, the received signal is passed to mixer 15. If device 10 is operating in a first mode of operation ("ONE" branch of 63), then mixer 15 uses a first inductor of inductor circuit 16 in the mixing process (64). Alternatively, if device 10 is operating in a second mode of operation ("TWO" branch of 63), then mixer 15 uses a second inductor of inductor circuit 16 in the mixing process (65). As described herein, the second inductor is disposed within the first inductor but includes independent terminals that are not tapped from the first inductor. A ground terminal may be shared by the first and second inductors. In this manner, mixer 15 can generate baseband signals for received signals associated with two different frequency bands.

The baseband signals can be converted to digital samples (66) via A/D converter 18 and a digital demodulation circuit 19 can perform demodulation (67) with respect to the digital baseband samples. Of course, the techniques of this disclosure can also work with purely analog signals, which would not be converted to digital samples, but would be demodulated in the analog domain. In other words, one or both of the modes of operation of device 10 could be a purely analog mode.

Figure 8:
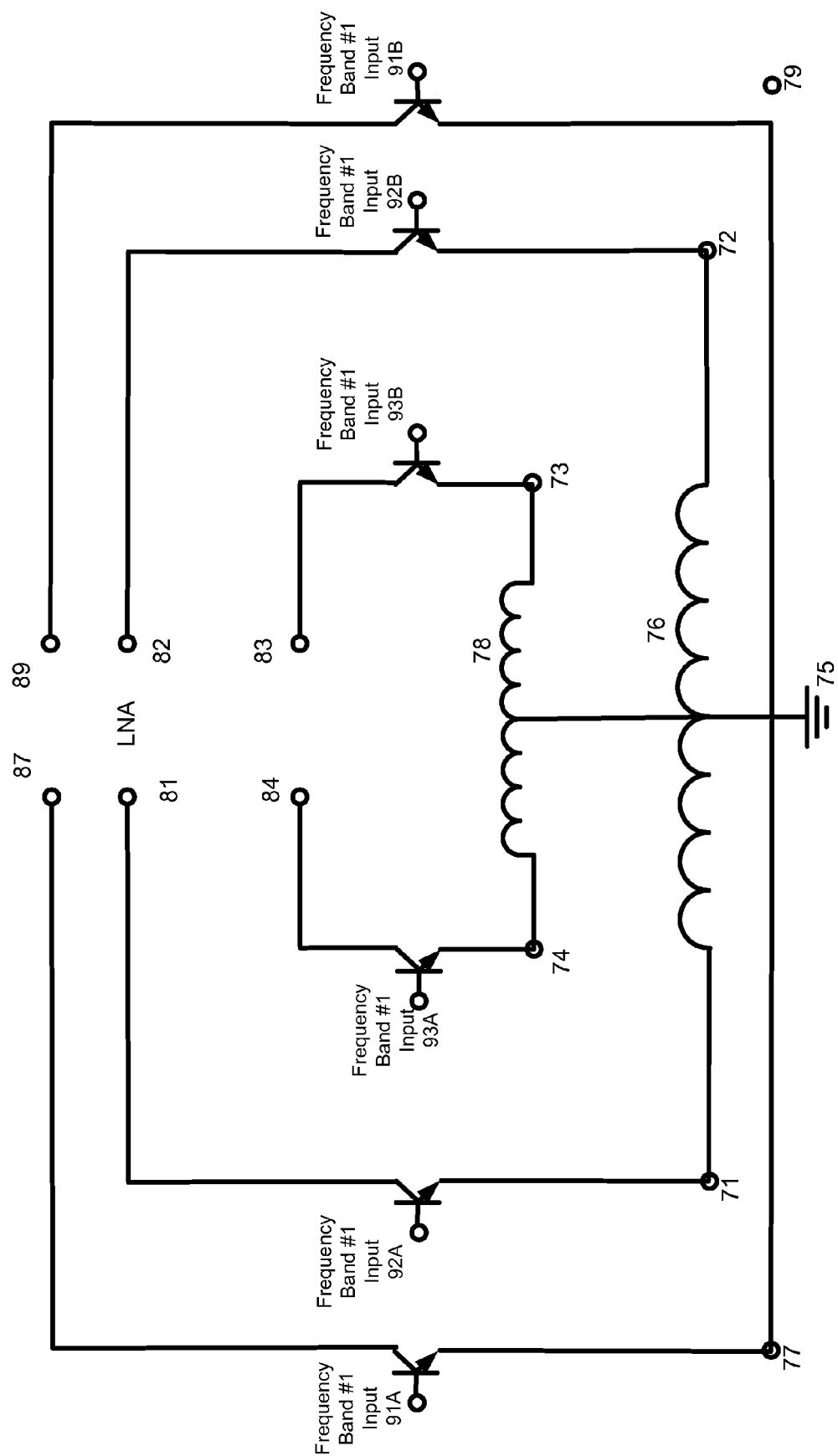
FIG. 8 is a schematic circuit diagram of a selective multi-differential branch which enables the selection of one differential path over another, wherein each differential path exhibits different gain and linearity characteristics at a single frequency.

In another embodiment the dual inductor circuit illustrated in FIGS. 5, 5A and 6 may be utilized in a low noise amplifier operating in a single frequency band. FIG. 8 is a schematic diagram of a selective multi-differential branch circuit which enables the selection of one differential branch independent of the other differential branches. Each of the differential branches having gain and linearity characteristics that differ from those of the other differential branches. The variance in the gain and linearity characteristics may be a result of different size inductors (or no inductors) being implemented in a particular differential branch. Selection of a particular differential branch may be dictated by the characteristic of a particular input signal that requires amplification. The relative noise and power of the input signal may require certain gain and linearity characteristics of the LNA amplifying the input signal in order to generate an appropriate or suitable output signal. Thus, by providing the LNA with a plurality of differential branches having varying gain and linearity characteristics is advantageous. Utilization of inductor-within-inductor layouts as shown in FIGS. 5 and 6 provide for inductors of varying size while also exhibiting improved space conservation characteristics and reductions in parasitic effects and electromagnetic interference relative to tapped inductor designs.

Referring to FIG. 8, an exemplary LNA is shown with three differential branches. Each of the three differential branches having a different gain and linearity characteristic for a signal operating at frequency $f_1$. The LNA of FIG. 8 is shown to be operating in the Cell frequency band for illustrative purposes only. The LNA of FIG. 8 may easily accept input signals operating in any frequency band. However, in the instant embodiment, each of the possible differential inputs 91A, 91B, 92A, 92B, 93A, 93B apply an input signal having the same relative frequency, $f_1$. The first differential branch is shown to have first inputs 91A and 91B and output nodes 87 and 89. In contrast to the second and third differential branch, the first differential branch has not inductor coil. Consequently, the first differential branch will likely have a higher gain and worst linearity characteristic of any of the three differential branches shown in FIG. 8.

A second differential branch having second inputs 92A and 92B, output nodes 81, 82 and a first planar inductor coil 76. The first planar inductor 76 couples a first terminal 71 and a second terminal 72 to a ground terminal 75. The second differential branch will have a second set of gain and linearity characteristics which differ from both the first differential branch (which has no inductor coil) and a third differential branch (having a different sized inductor coil 78) for a signal operating at the same frequency, $f_1$.

The third differential branch having third inputs 93A and 93B, output nodes 83, 84, and a second planar inductor coil 78 coupled to a ground terminal. The inductor coil 78 may have more or fewer coils than inductor coil 76 and may be formed within inductor coil 76 as shown for example, in FIGS. 5 and 6 and may be electrically independent from the first planar inductor 47 as it is not tapped from the first planar inductor 76. The second planar inductor 78 couples a third terminal 73 and a fourth terminal 74 to a ground terminal 75. Again, the third and fourth terminals 7 and 74 of the second planar inductor 78 are independent from the first planar inductor 76 insofar as the third and fourth terminals 73 and 74 are not tapped from the first planar inductor 76. As a result of the different size of inductor coil 78 from inductor coil 76, the third differential branch may have a third set of gain and linearity characteristics when coupled to a signal operating at the same frequency, $f_1$.

In operation, a wireless device may select a particular differential branch by applying a differential input signal to either the first, second, or third differential inputs, 91A and 91B, 92A and 92B, or 93A and 93B, and the an output may be coupled to the corresponding output nodes 87, 89; 81, 82; or 83, 84 depending on what gain and linearity characteristics are required to apply to the input signal operating at frequency f1. One of ordinary skill in the art would recognize that the circuit of FIG. 8 may operate at any frequency band, such as the PCS or some other data communication frequency band. In addition, while the circuit illustrate in FIG. 8 depicts three separate differential branches, more or fewer branches may be implemented. Additional differential branches may be added to the circuit, wherein each differential branch includes a differently sized inductor coil to generate a differential branch with an additional set of gain and linearity characteristics. It is also noted that while bipolar transistors coupled to the input signals are shown in FIG. 8 to select a particular differential branch, other transistor technologies such as FET, MOSFET, CMOS, JFET, etc. may be utilized A number of examples have been described. The disclosed inductor-inside-inductor can be fabricated onto a radio frequency integrated circuit (RFIC), and may reduce the needed area and costs associated with such RFIC fabrication. Although described with reference to a mixer on an RFIC chip, the disclosed dual inductor circuit could be used in other devices. Also, the disclosed inductor could also be used in a mixer of an RF transmitter that mixes baseband signals onto a carrier. Additionally, the disclosed dual inductor is described with reference to a LNA in a single frequency mode. The dual inductor circuit may be used in other devices and components operating in a single frequency mode. Accordingly, these and other examples are within the scope of the following claims.

The invention claimed is:

1. A multi-band wireless communication device comprising a component operating in a dual frequency mode, the component comprising a dual inductor circuit, wherein the dual inductor circuit comprises:
    a first planar inductor coupling a first terminal and a second terminal to a ground terminal; and
    a second planar inductor formed within the first planar inductor, the second planar inductor coupling a third terminal and a fourth terminal to the ground terminal, wherein the third and fourth terminals of the second planar inductor are electrically independent from the first inductor and the first and second terminals.

2. The multi-band wireless communication device of claim 1, wherein the third and fourth terminals of the second inductor are not tapped from the first inductor.

3. The multi-band wireless communication device of claim 1, wherein the first inductor is tuned to a first frequency band and the second inductor is tuned to a second frequency band.

4. The multi-band wireless communication device of claim 3, wherein the first inductor is tuned to account for parasitic effects of the second inductor and the second inductor is tuned to account for parasitic effects of the first inductor.

5. The multi-band wireless communication device of claim 1, wherein the second inductor is separated from the first inductor by greater than approximately 20 microns.

6. The multi-band wireless communication device of claim 1, wherein a surface area associated with the circuit defines less than approximately 0.3 square millimeters.

7. The multi-band wireless communication device of claim 1, wherein the multi-band wireless communication device is configured to support a first frequency mode of operation in which the component is coupled to the first inductor and a second frequency mode of operation wherein the component is coupled to the second inductor.

8. The multi-band wireless communication device of claim 7, wherein the first mode of operation is associated with a first frequency band below approximately 1.0 gigahertz (GHz) and the second mode of operation is associated with a second frequency band above approximately 1.0 GHz.

9. The multi-band wireless communication device of claim 8, wherein the first frequency band is around approximately 800 megahertz (MHz) and the second frequency band is around approximately 2.4 GHz.

10. The multi-band wireless communication device of claim 1, wherein the component is a mixer that mixes baseband signals from received signals.

11. The multi-band wireless communication device of claim 10, wherein the mixer generates baseband signals, the device further comprising:
   an analog-to-digital converter that converts the baseband signals to digital baseband samples; and
   a digital demodulation circuit that demodulates the digital baseband samples.

12. The multi-band wireless communication device of claim 10, wherein the dual inductor circuit is included in an amplifier of the mixer.

13. The multi-band wireless communication device of claim 1, wherein the first and second planar inductors have different resonance frequencies.

* * * * *